United States Patent
Baniecki et al.

(10) Patent No.: US 10,672,965 B2
(45) Date of Patent: Jun. 2, 2020

(54) METHOD FOR PRODUCING THERMOELECTRIC CONVERSION ELEMENT

(71) Applicant: FUJITSU LIMITED, Kawasaki-shi, Kanagawa (JP)

(72) Inventors: John David Baniecki, Zama (JP); Masatoshi Ishii, Kawasaki (JP); Kazuaki Kurihara, Atsugi (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 16/416,182

(22) Filed: May 18, 2019

(65) Prior Publication Data

US 2019/0280180 A1 Sep. 12, 2019

Related U.S. Application Data

(62) Division of application No. 14/636,629, filed on Mar. 3, 2015, now Pat. No. 10,347,810.

(30) Foreign Application Priority Data

Mar. 6, 2014 (JP) .................................. 2014-044141

(51) Int. Cl.
*H01L 35/22* (2006.01)
*H01L 35/32* (2006.01)
*H01L 35/34* (2006.01)

(52) U.S. Cl.
CPC .............. *H01L 35/22* (2013.01); *H01L 35/32* (2013.01); *H01L 35/34* (2013.01)

(58) Field of Classification Search
CPC ......... H01L 35/00; H01L 35/22; H01L 35/32; H01L 35/34
See application file for complete search history.

(56) References Cited

U.S. PATENT DOCUMENTS

| 5,275,001 A * | 1/1994 | Yokotani | ................. | H01L 35/22 |
| | | | | 136/239 |
| 2006/0137732 A1* | 6/2006 | Farahani | ................. | H01L 23/38 |
| | | | | 136/201 |

FOREIGN PATENT DOCUMENTS

| JP | H05-218511 | | 8/1993 |
| JP | 2012-186230 A1 | | 9/2012 |
| JP | 2012186230 A | * | 9/2012 |

OTHER PUBLICATIONS

Machine translation of JP-2012186230-A, Baniecki, John et al. (Year: 2012).*

(Continued)

*Primary Examiner* — Mayla Gonzalez Ramos
(74) *Attorney, Agent, or Firm* — Kratz, Quintos & Hanson, LLP

(57) ABSTRACT

A thermoelectric conversion element includes a film composed of a conductive oxide, a first electrode disposed on one end of the film composed of the conductive oxide, and a second electrode disposed on another end of the film composed of the conductive oxide, wherein the conductive oxide has a tetragonal crystal structure expressed by $ABO_{3-x}$, where $0.1<x<1$, wherein the conductive oxide has a band structure in which a Fermi level intersects seven bands between a $\Gamma$ point and an R point, and wherein the first electrode and the second electrode are disposed on the film composed of the conductive oxide so that electrical charge moves in a direction of a smallest vector among three primitive translation vectors of the crystal structure.

6 Claims, 7 Drawing Sheets

(56) References Cited

OTHER PUBLICATIONS

J.D. Baniecki, et al.; "Density functional theory and experimental study of the electronic structure and transport properties of La, V, Nb, and Tb doped SrTiO3"; Journal of Applied Physics 113; 2013; pp. 013701-1 and 013701-11 (11 sheets)/ p. 1 of specification.

* cited by examiner

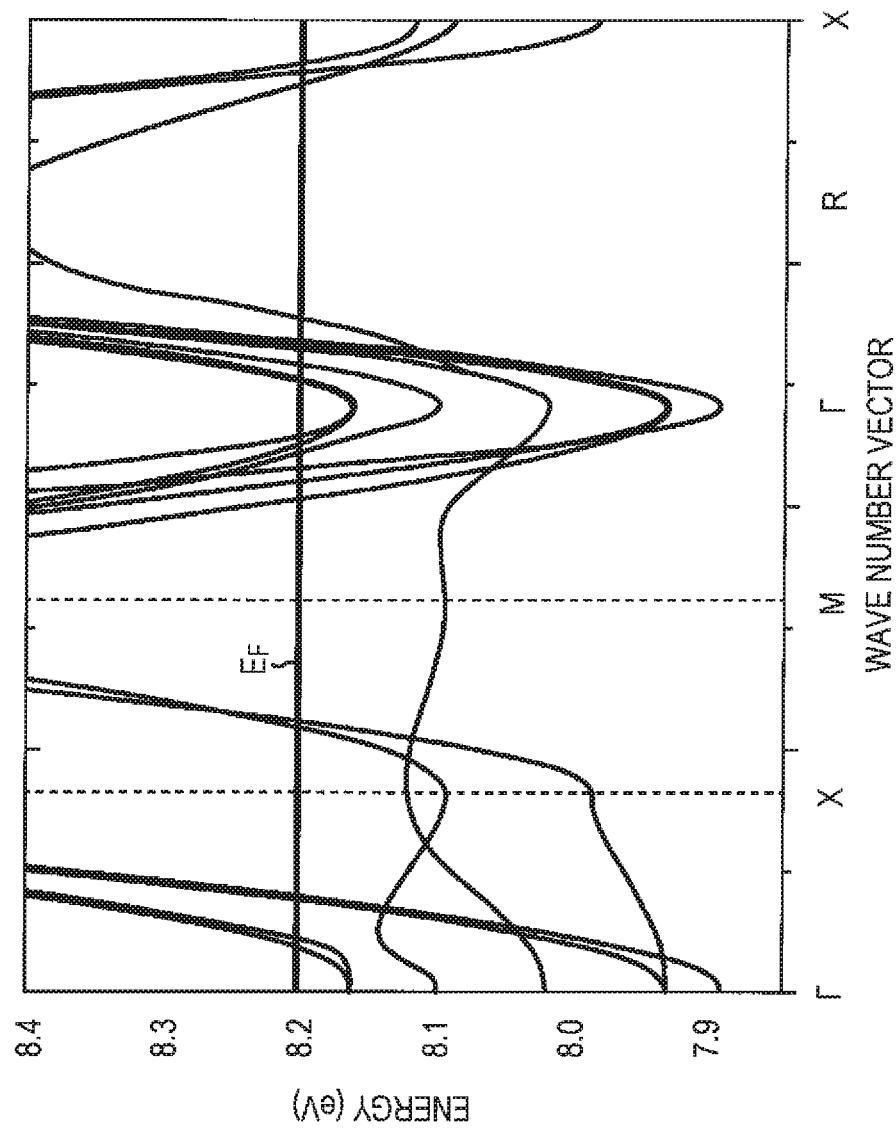

METHOD FOR PRODUCING THERMOELECTRIC CONVERSION ELEMENT

CROSS-REFERENCE TO RELATED APPLICATION

This application is based upon and claims the benefit of priority of the prior Japanese Patent Application No. 2014-044141, filed on Mar. 6, 2014, the entire contents of which are incorporated herein by reference.

FIELD

The embodiments discussed herein are related to a thermoelectric conversion element, a method for producing the thermoelectric conversion element, and the like.

BACKGROUND

Recently, attention has been focused on use of $SrTiO_3$ as a material for thermoelectric conversion elements because $SrTiO_3$ has a high power factor and causes a low environmental load (for example, see Japanese Laid-open Patent Publication No. 5-218511, Japanese Laid-open Patent Publication No. 2012-186230, and J. D. Baniecki et al., *Journal of Applied Physics* 113, 013701, 2013).

However, it has been difficult to realize a sufficient thermoelectric performance even using a thermoelectric conversion element including $SrTiO_3$.

Accordingly it is desired a thermoelectric conversion element that allows a higher thermoelectric performance to be achieved, a method for producing such a thermoelectric conversion element, and the like.

SUMMARY

According to an aspect of the invention, a thermoelectric conversion element includes a film composed of a conductive oxide, a first electrode disposed on one end of the film composed of the conductive oxide, and a second electrode disposed on another end of the film composed of the conductive oxide, wherein the conductive oxide has a tetragonal crystal structure expressed by $ABO_{3-x}$, where $0.1<x<1$, wherein the conductive oxide has a band structure in which a Fermi level intersects seven bands between a $\Gamma$ point and an R point, and wherein the first electrode and the second electrode are disposed on the film composed of the conductive oxide so that electrical charge moves in a direction of a smallest vector among three primitive translation vectors of the crystal structure.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 2A is a diagram illustrating the band structure of $SrTiO_{2.875}$;

DESCRIPTION OF EMBODIMENTS

Hereinafter, the embodiments discussed herein are described specifically with reference to the attached drawings.

First Embodiment

Figure 1:
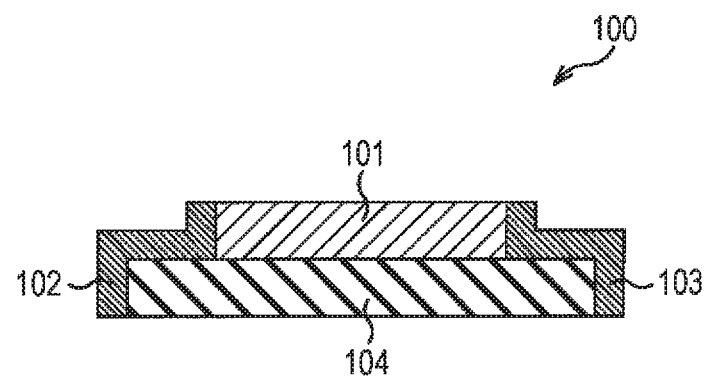
FIG. 1 is a cross-sectional view of a thermoelectric conversion element according to the first embodiment, which illustrates the structure of the thermoelectric conversion element.

The first embodiment is described below. The first embodiment relates to a thermoelectric conversion element. FIG. 1 is a cross-sectional view of the thermoelectric conversion element according to the first embodiment, which illustrates the structure of the thermoelectric conversion element.

As illustrated in FIG. 1, a thermoelectric conversion element 100 according to the first embodiment includes a conductive oxide film 101 formed on a substrate 104, an electrode 102 disposed on one end of the conductive oxide film 101, and an electrode 103 disposed on the other end of the conductive oxide film 101.

The conductive oxide film 101 is composed of a conductive oxide, which has a tetragonal crystal structure expressed by $ABO_{3-x}$ ($0.1<x<1$). The electrodes 102 and 103 are disposed on the conductive oxide film 101 so that electrical charge moves in the direction of the smallest vector among three primitive translation vectors of the crystal structure. The conductive oxide has a band structure in which the Fermi level intersects seven bands between the r point and the R point.

For example, the conductive oxide film 101 is composed of $SrTiO_{2.875}$ ($x=0.125$). The lengths of the three axes of the unit crystal lattice of $SrTiO_{2.875}$ are about 3.849 Å, 3.849 Å, and 3.860 Å, and the electrodes 102 and 103 are disposed on the conductive oxide film 101 so that electrical charge moves in a direction parallel to the axis having a length of about 3.849 Å. As illustrated in FIG. 2A, $SrTiO_{2.875}$ has a band structure in which the Fermi level $E_F$ intersects seven bands between the $\Gamma$ point and the R point.

Generally, power factor PF is calculated as $PF=S^2 \times \sigma$, where S represents the Seebeck coefficient and $\sigma$ represents electric conductivity. The larger the number of bands that intersect the Fermi level between the $\Gamma$ point and the R point, the higher the Seebeck coefficient. The number of such bands is seven in the first embodiment while the number of such bands is six in $SrTiO_3$. Thus, according to the first embodiment, a Seebeck coefficient S and a power factor PF that are higher than those of a thermoelectric conversion element including $SrTiO_3$ may be achieved.

Figure 2B:
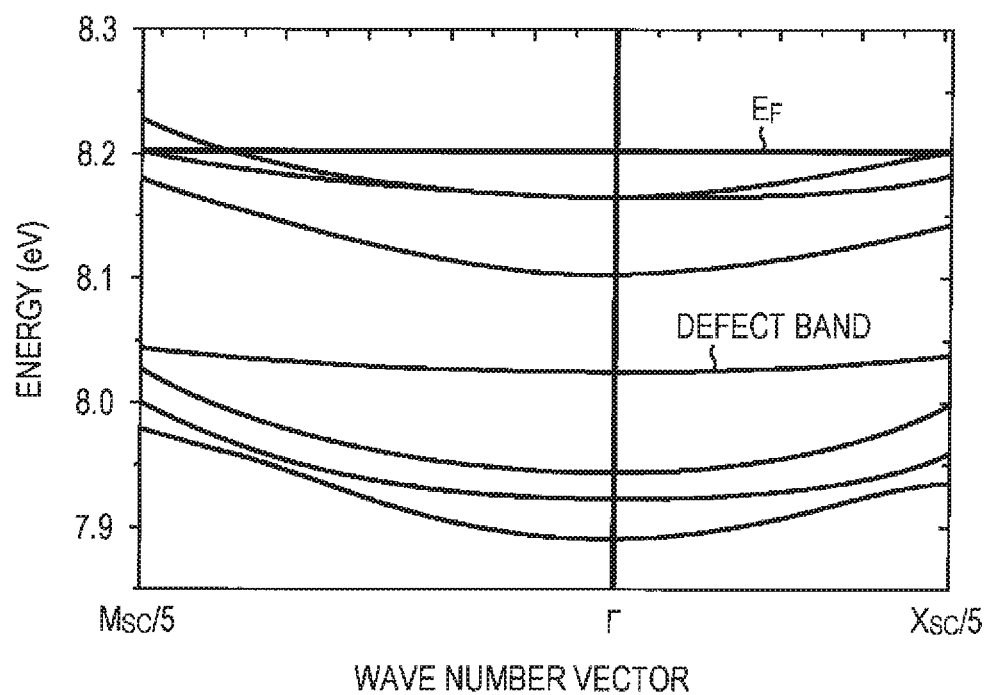
FIG. 2B is a diagram illustrating the band structure of $SrTiO_{2.875}$.

In a conductive oxide having a band structure in which the Fermi level intersects seven bands between the Γ point and the R point, the Fermi level is higher than the lowest conduction band by 0.15 eV or more and the defect band is higher than the lowest conduction band by 0.2 eV or more. In FIGS. 2A and 2B, the Fermi level $E_F$ is higher than the lowest conduction band by 0.15 eV or more. This allows a high thermoelectric performance to be realized.

The value of x in $ABO_{3-x}$ is more than 0.1 because, if x is 0.1 or less, a sufficiently high power factor PF may fail to be achieved due to an insufficient amount of oxygen vacancies. The value of x in $ABO_{3-x}$ is less than 1 because, if x is 1 or more, a sufficiently high power factor PF may fail to be achieved due to an excessive amount of oxygen vacancies, which results in the inconsistency of characteristics of the thermoelectric conversion element.

FIG. 7 summarizes the characteristics of various materials having a tetragonal crystal structure expressed by $ABO_{3-x}$. In FIG. 7, $S_L$ and $S_S$ represent the Seebeck coefficients measured in a direction parallel to the longest axis among three axes of the unit crystal lattice, that is, the L-direction, and in a direction parallel to the shortest axis among three axes of the unit crystal lattice, that is, the S-direction, respectively. In FIG. 7, $\sigma_L/\tau_0$ and $\sigma_S/\tau_0$ represent values obtained by dividing electric conductivities measured in the L-direction and S-direction by relaxation time $\tau_0$, respectively. In FIG. 7, $PF_L$ and $PF_S$ represent power factors measured in the L-direction and S-direction, respectively, which are calculated as $PF_L = S_L^2 \times \sigma_L/\tau_0$ and $PF_S = S_S^2 \times \sigma_S/\tau_0$.

TABLE 1-1

| No. | Composition | $S_L$ (μV/K) | $S_S$ (μV/K) | $\sigma_L/\tau_0$ ($\times 10^{19}$ $Sm^{-1}sec^{-1}$) | $\sigma_S/\tau_0$ ($\times 10^{19}$ $Sm^{-1}sec^{-1}$) |
|---|---|---|---|---|---|
| 1 | $SrTiO_{2.875}$ | −37.68 | −36.64 | 8.14 | 12.88 |
| 2 | $Sr_{0.875}La_{0.125}TiO_3$ | −41.3 | −41.3 | 8.10 | 8.10 |
| 3 | $Sr_{0.5}La_{0.5}TiO_3$ | −11.67 | −11.67 | 25.90 | 25.90 |
| 4 | $SrTiO_{2.9375}$ | −40.3 | −39.1 | 6.14 | 8.88 |
| 5 | $SrTiO_{2.00}$ | −14.5 | −10.6 | 64.20 | 122.2 |

TABLE 1-2

| No. | $PF_L/\tau_0$ ($\times 10^{10}$ $Wm^{-1}K^{-2}sec^{-1}$) | $PF_S/\tau_0$ ($\times 10^{10}$ $Wm^{-1}K^{-2}sec^{-1}$) | Remarks |
|---|---|---|---|
| 1 | 11.56 | 16.4 | Example |
| 2 | 13.81 | 13.81 | Comparative example |
| 3 | 3.53 | 3.53 | Comparative example |
| 4 | 9.97 | 13.58 | Comparative example |
| 5 | 13.5 | 13.73 | Comparative example |

As summarized in Tables 1-1 and 1-2, a markedly high power factor is obtained in the S direction of $SrTiO_{2.875}$. Note, each values in the row of No. 1 in the tables 1-1 and 1-2 indicate the values of $SrTiO_{2.875}$, and the values in the row of No. 2 indicate the values of $Sr_{0.875}La_{0.125}TiO_3$, for example.

The thermoelectric conversion element 100 according to the first embodiment may be used as an n-type thermoelectric conversion element.

A method for producing the thermoelectric conversion element according to the first embodiment is described below. FIGS. 3A to 3D are cross-sectional views of the thermoelectric conversion element according to the first embodiment, which illustrate steps of the method for producing the thermoelectric conversion element in order.

Figure 3A:
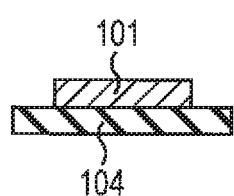
FIGS. 3A to 3D are cross-sectional views of a thermoelectric conversion element according to the first embodiment, which illustrate steps of a method for producing the thermoelectric conversion element in order.
Figure 3B:
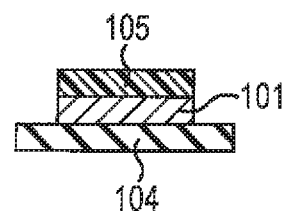

As illustrated in FIG. 3A, a conductive oxide film 101 including oxygen vacancies is formed on a substrate 104. The substrate 104 may be, for example, a single-crystal substrate of $(La_{0.3}Sr_{0.7})(Al_{0.65}Ta_{0.35})O_3$ (LSAT). The planar shape of the substrate 104 may be, for example, 15-mm square. The thickness of the substrate 104 may be, for example, 0.5 mm.

An $SrTiO_{2.5}$ film that serves as the conductive oxide film 101 may be formed, for example, under the following conditions. An SrTiOδ single-crystal film is formed using an $SrTiO_3$ target and a Q-switch Nd:YAG laser at a pulse rate of 10 Hz with an irradiation energy of 0.62 J/cm². The spacing between the substrate 104 and the target is set to, for example, 5 cm. The temperature of the substrate 104 is set to, for example, 900° C. The pressure inside the chamber is set to, for example, $10^{-6}$ Torr. After the single-crystal film is formed, the temperature is kept at 900° C., the pressure inside the chamber is reduced to $10^{-9}$ Torr, and the resulting substrate is maintained for 3 hours. The substrate may optionally be annealed in an atmosphere including a reducing gas after the formation of the single-crystal film, which increases the amount of oxygen vacancies. For example, the substrate may be annealed in a 95-vol % Ar and 5-vol % $H_2$ mixed gas atmosphere at 1 atm. An oxygen gas may optionally be charged into the chamber during the formation of the single-crystal film, which reduces the amount of oxygen vacancies. For example, during the formation of the single-crystal film, the temperature of the substrate 104 is set to 600° C. and the oxygen pressure inside the chamber is set to 50 mTorr. The irradiation energy may be set to 0.4 J/cm².

After the formation of the conductive oxide film 101, as illustrated in FIG. 313, a mask 105 is formed on the conductive oxide film 101. The mask 105 may be, for example, a metal mask or a photoresist mask.

Figure 3C:
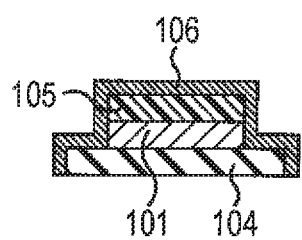

As illustrated in FIG. 3C, a conductive film 106 is formed on the upper and side surfaces of the mask 105, the side surface of the conductive oxide film 101, and the upper and side surfaces of the substrate 104. The conductive film 106 is, for example, a multilayer body including a Cr film having a thickness of 25 nm and an Au film having a thickness of 500 nm which are formed by sputtering. At this time, for example, the RF power is set to 80 W, the temperature is set to room temperature (about 25° C.), and the atmosphere is set to a 0.1-Pa Ar gas atmosphere.

Figure 3D:
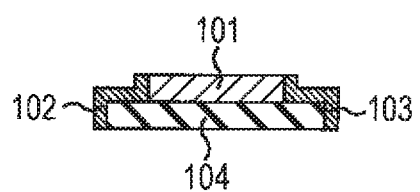

As illustrated in FIG. 3D, subsequently, the mask 105 and a portion of the conductive film 106 formed on the upper and side surfaces of the mask 105 are removed. As a result, the remaining portion of the conductive film 106 is left on the side surface of the conductive oxide film 101 and the upper and side surfaces of the substrate 104, which serve as the electrode 102 and the electrode 103.

Thus, the thermoelectric conversion element is produced.

Second Embodiment

Figure 4:
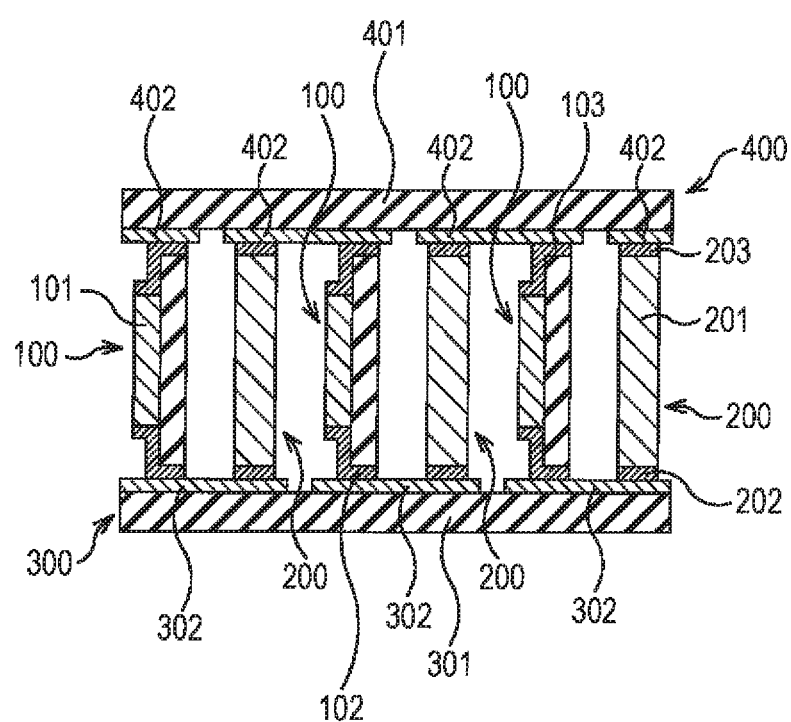
FIG. 4 is a cross-sectional view of a thermoelectric conversion device according to the second embodiment, which illustrates the structure of the thermoelectric conversion device.

The second embodiment is described below. The second embodiment relates to a thermoelectric conversion device including the thermoelectric conversion element. FIG. 4 is a cross-sectional view of the thermoelectric conversion device according to the second embodiment, which illustrates the structure of the thermoelectric conversion device.

In the second embodiment, as illustrated in FIG. 4, a plurality of thermoelectric conversion elements 100 and a plurality of thermoelectric conversion elements 200 are disposed between a low-temperature-side substrate 300 and a high-temperature-side substrate 400. The low-temperature-side substrate 300 includes an insulating substrate 301 and a plurality of wires 302 formed on the insulating substrate 301. The high-temperature-side substrate 400 includes an insulating substrate 401 and a plurality of wires 402 formed on the insulating substrate 401. The thermoelectric conversion element 200 includes a p-type semiconductor film 201, an electrode 202 disposed on one end of the p-type semiconductor film 201, and an electrode 203 disposed on the other end of the p-type semiconductor film 201. The electrode 102 and the electrode 202 are connected to the wire 302, the electrode 103 and the electrode 203 are connected to the wire 402, and thereby the thermoelectric conversion elements 100 and the thermoelectric conversion elements 200 are alternately connected to each other in series.

Figure 5:
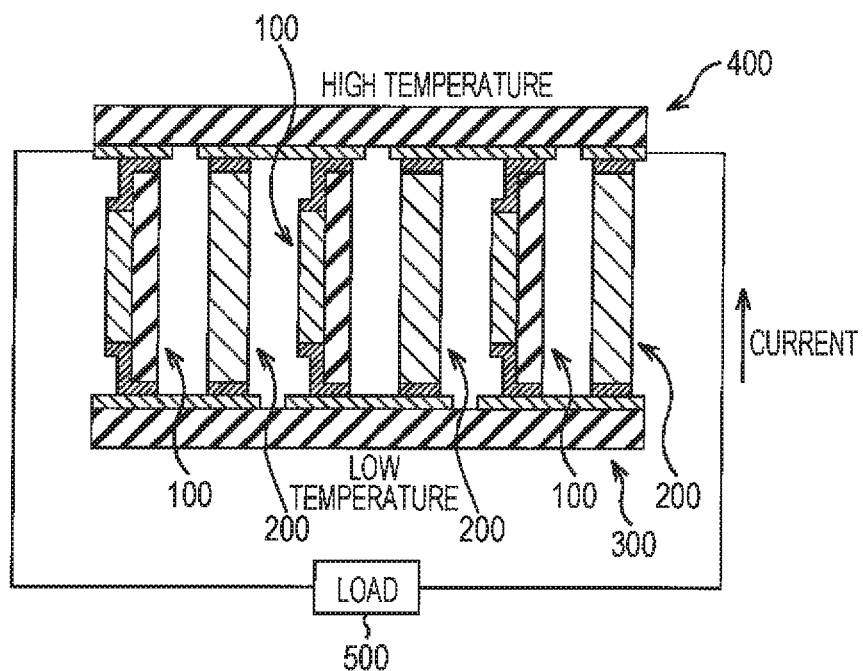
FIG. 5 is a diagram illustrating an example of use of a thermoelectric conversion device according to the second embodiment.

In the thermoelectric conversion device, as illustrated in FIG. 5, a current flows when a load 500 is connected between two wires 402 located at the respective ends of the high-temperature-side substrate 400, heat is supplied from a heat source to the high-temperature-side substrate 400, and the low-temperature-side substrate 300 is provided so that heat is dissipated from the low-temperature-side substrate 300.

Figure 6A:
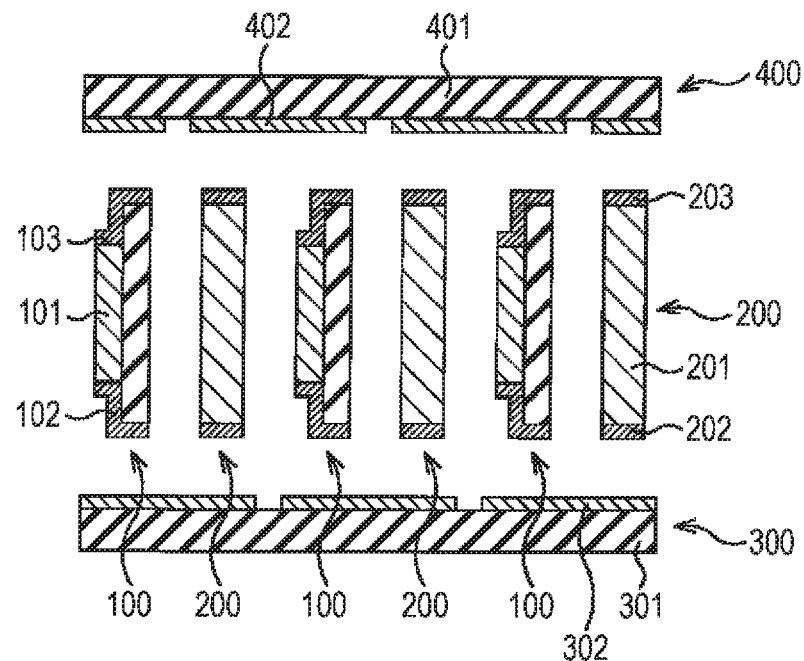
FIGS. 6A and 6B are cross-sectional views of a thermoelectric conversion device according to the second embodiment, which illustrate steps of a method for producing the thermoelectric conversion device in order.
Figure 6B:
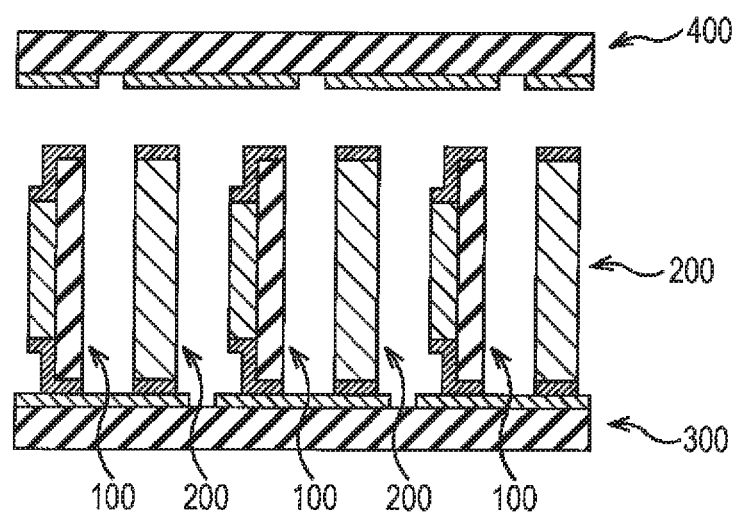

A method for producing the thermoelectric conversion device according to the second embodiment is described below. FIGS. 6A and 6B are cross-sectional views of the thermoelectric conversion device according to the second embodiment, which illustrates steps of the method for producing the thermoelectric conversion device in order.

As illustrated in FIG. 6A, thermoelectric conversion elements 100, thermoelectric conversion elements 200, a low-temperature-side substrate 300, and a high-temperature-side substrate 400 are prepared. A p-type semiconductor film 201 of the thermoelectric conversion element 200 may be, for example, a BiTe film. Electrodes 202 and Electrodes 203 may be, for example, multilayer bodies including a Cr film and a Au film similarly to the electrodes 102 and the electrodes 103 described above. An insulating substrate 301 and an insulating substrate 401 are preferably substrates having a high heat conductivity, such as $SrTiO_3$ substrates. Wires 302 and 402 may be, for example, Cu wires.

As illustrated in FIG. 68, the electrodes 102 of the thermoelectric conversion elements 100 and the electrodes 202 of the thermoelectric conversion elements 200 are fixed to the respective wires 302 of the low-temperature-side substrate 300 using, for example, a conductive paste. Subsequently, the electrodes 103 of the thermoelectric conversion elements 100 and the electrodes 203 of the thermoelectric conversion elements 200 are fixed to the respective wires 402 of the high-temperature-side substrate 400. Thus, the thermoelectric conversion device is produced.

The conductive oxide may be $SrZrO_{3-x}$ (0.1<x<1), $Sr(Ti,Zr)O_{3-x}$ (0.1<x<1), $BaTiO_{3-x}$ (0.1<x<1), $BaZrO_{3-x}$ (0.1<x<1), $Ba(Ti,Zr)O_{3-x}$ (0.1<x<1), $(Ba,Sr)TiO_{3-x}$ (0.1<x<1), $(Ba,Sr)ZrO_{3-x}$ (0.1<x<1), or $(Ba,Sr)(Ti,Zr)O_{3-x}$ (0.1<x<1). These conductive oxides may be doped with La and/or Nb. A method for forming the conductive oxide film is not particularly limited. The thickness of the conductive oxide film is not particularly limited.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A method for producing a thermoelectric conversion element, the method comprising:
    disposing a substrate having a first surface, a first sidewall provided at one end of the first surface and a second sidewall provided at the other end of the first surface opposite to the one end;
    disposing, on the substrate, a film composed of a conductive oxide, and having a second surface having a surface area smaller than a surface area of the first surface, a third sidewall provided at a side of the one end and a fourth sidewall provided at a side of the other end;
    disposing a first electrode continuously on the first sidewall, the third sidewall and a third surface corresponding to a first part of the first surface and exposed between the first sidewall and the third sidewall; and
    disposing a second electrode continuously on the second sidewall, the fourth sidewall and a fourth surface corresponding to a second part of the first surface and exposed between the second sidewall and the fourth sidewall,
    wherein the conductive oxide has a tetragonal crystal structure expressed by $ABO_{3-x}$, where 0.1<x<1,
    wherein the conductive oxide has a band structure in which a Fermi level intersects seven bands between a r point and an R point,
    wherein the first electrode and the second electrode are disposed on the film composed of the conductive oxide so that electrical charge moves in a direction of a smallest vector among three primitive translation vectors of the crystal structure.

2. The method for producing a thermoelectric conversion element according to claim 1, further comprising:
    forming a mask on the film composed of the conductive oxide;
    forming a conductive film on the first sidewall, the second sidewall, the third sidewall, the fourth sidewall and an upper surface of the mask; and
    removing the mask and a portion of the conductive film formed on the upper surface of the mask to leave the remaining portion of the conductive film as the first electrode and the second electrode.

3. The method for producing a thermoelectric conversion element according to claim 1,
    wherein A of $ABO_{3-x}$ expressing the crystal structure is Sr.

4. The method for producing a thermoelectric conversion element according to claim 1,
    wherein B of $ABO_{3-x}$ expressing the crystal structure is Ti.

5. The method for producing a thermoelectric conversion element according to claim 1,
   wherein the Fermi level of the conductive oxide is higher than a lowest conduction band of the conductive oxide by 0.15 eV or more.

6. The method for producing a thermoelectric conversion element according to claim 1,
   wherein a defect band of the conductive oxide is higher than a lowest conduction band of the conductive oxide by 0.2 eV or more.

\* \* \* \* \*